(12) United States Patent
Sekimoto et al.

(10) Patent No.: US 6,185,370 B1
(45) Date of Patent: Feb. 6, 2001

(54) HEATING APPARATUS FOR HEATING AN OBJECT TO BE PROCESSED

(75) Inventors: Eiichi Sekimoto; Mitsuhiro Tanoue, both of Kumamoto-ken (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/392,639

(22) Filed: Sep. 9, 1999

(30) Foreign Application Priority Data

Sep. 9, 1998 (JP) .................................................. 10-270495

(51) Int. Cl.[7] .............................. A01G 13/06; H05B 3/68; C23C 16/00
(52) U.S. Cl. .................... 392/386; 219/444.1; 118/715; 118/723 VE; 118/724
(58) Field of Search ................................ 392/386, 388, 392/416, 418; 219/444.1; 118/715, 716, 723 VE, 724, 725, 726, 727, 728, 729, 733

(56) References Cited

U.S. PATENT DOCUMENTS

| 4,940,213 | * | 7/1990 | Ohmine et al. | 118/725 |
| 5,582,866 | * | 12/1996 | White | 118/715 |
| 5,819,683 | * | 10/1998 | Ikeda et al. | 118/715 |
| 6,007,634 | * | 12/1999 | Weber et al. | 118/725 |

FOREIGN PATENT DOCUMENTS 4-147612   5/1992   (JP) .

* cited by examiner

*Primary Examiner*—Sang Paik
(74) *Attorney, Agent, or Firm*—Radar, Fishman & Grauer (57) ABSTRACT

An exhaust hole has a size covering not only a first region above a hot plate but also a second region surrounding the first region. A plate ember with a plurality of openings is disposed at the mouth of the exhaust hole. The exhaust hole exhausts air from the first region and the second region, even when the heat processing is not performed. Therefore, a solvent volatilized in the first region is also exhausted from the second region and will not leak outside the apparatus.

32 Claims, 11 Drawing Sheets

HEATING APPARATUS FOR HEATING AN OBJECT TO BE PROCESSED

FIELD OF THE INVENTION

The present invention relates to a heating apparatus for heating an object to be processed (hereinafter referred to as a 'target object') such as a semiconductor wafer during a resist processing step, for example.

BACKGROUND OF THE INVENTION

In a process for manufacturing a semiconductor device, a photolithography technology is used. In the photolithography technology, a resist is coated upon a surface of a semiconductor wafer (hereinafter referred to as a "wafer"), the coated resist is exposed to a predetermined pattern and then developed. Thus, a resist film with a predetermined pattern is formed upon the wafer. And then, a circuit with a predetermined pattern is formed by film-forming and etching treatment.

Conventionally, such series of resist processing is performed using a coating and developing system where a plurality of units such as a resist coating unit, a developing unit and a heating unit are disposed integrally.

The heating unit has a hot plate disposed in the center for heating a target object such as a semiconductor wafer. A plurality of support pins appear from and disappear into the hot plate for receiving and delivering the wafers. A shutter member, also appearing and disappearing, is disposed around the hot plate surrounding the hot plate. Conventionally, only the inside of the shutter member was exhausted.

However, there has been a problem that the volatilized solvent filling the closed space formed by the shutter member leaks outside when the shutter member descends after the heating process, giving ill influence to other processes.

SUMMARY OF THE INVENTION

The present invention aims to solve the above-mentioned problem. Its object is to provide a heating apparatus from which the volatilized solvent does not leak outside.

Another object of the invention is to provide a heating apparatus performing uniform exhaustion.

Still another object of the invention is to provide a heating apparatus wherein the volatilized solvent does not form a dew and fall upon the target object.

To solve the above-described problems, a main aspect of the present invention is a developing apparatus having a heating region, an exhaust cover and an exhausting means. The heating region has a first region for heating a mounted target object. The exhaust cover has an exhaust hole disposed facing the first region and a second region surrounding the first region. The exhausting means exhausts the first and the second regions through the exhaust hole. The heating apparatus also has a shutter member for closing up the space between a periphery of the first region and the exhaust cover while heating the target object.

Therefore, the solvent volatilized inside the first region is also exhausted in the second region, and will not leak outside the apparatus. A surrounding gas not including any solvent is taken from the second region into the exhaust cover. Thus, a density of the volatilized solvent inside the exhaust cover will decrease and the volatilized solvent will not form a dew, sticking inside the exhaust cover.

DETAILED DESCRIPTION OF THE PREFERRED EMBODIMENT

A preferred embodiment according to the present invention will be explained with reference to the accompanied drawings.

Figure 1:
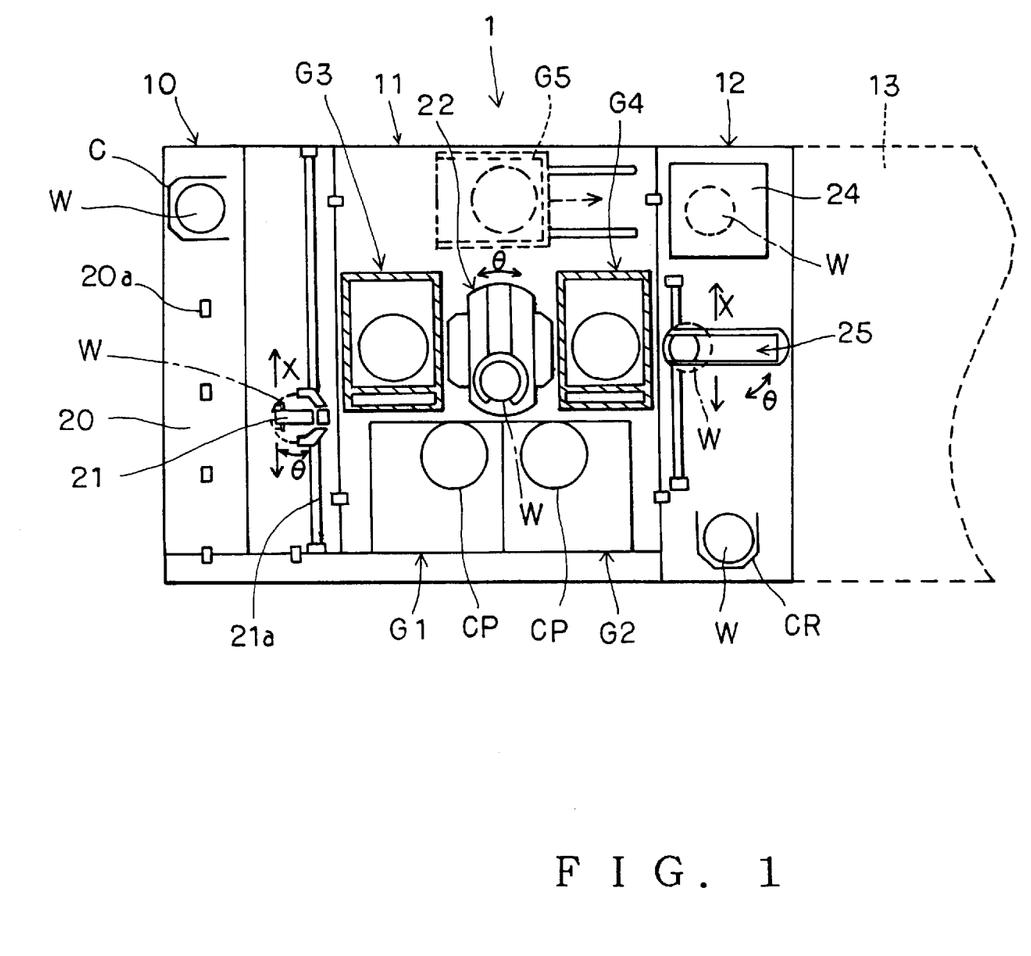
FIG. 1 is a plan view of a coating and developing apparatus concerning a preferred embodiment of the present invention.
Figure 2:
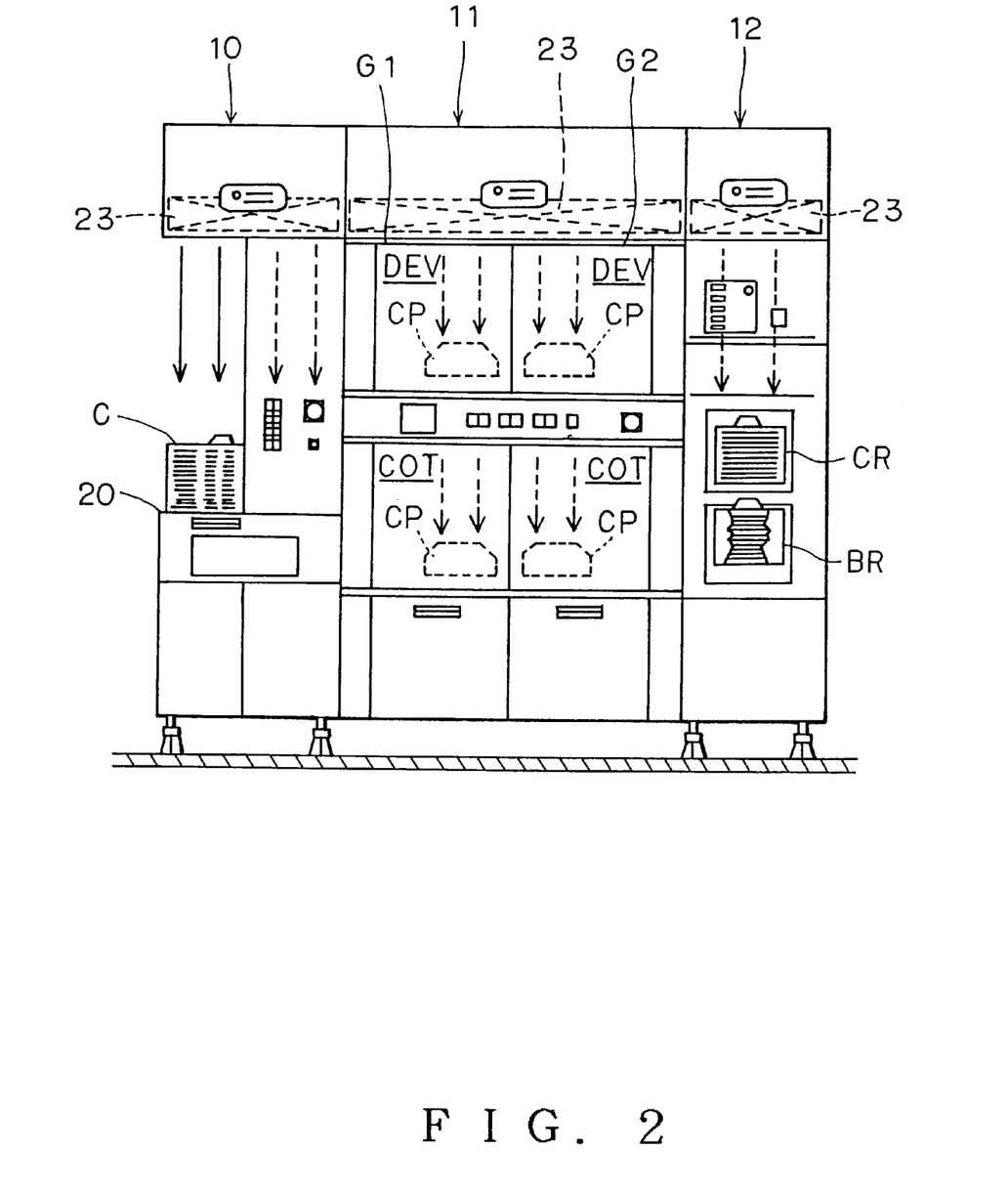
FIG. 2 is a front view of the coating and developing apparatus shown in FIG. 1.
Figure 3:
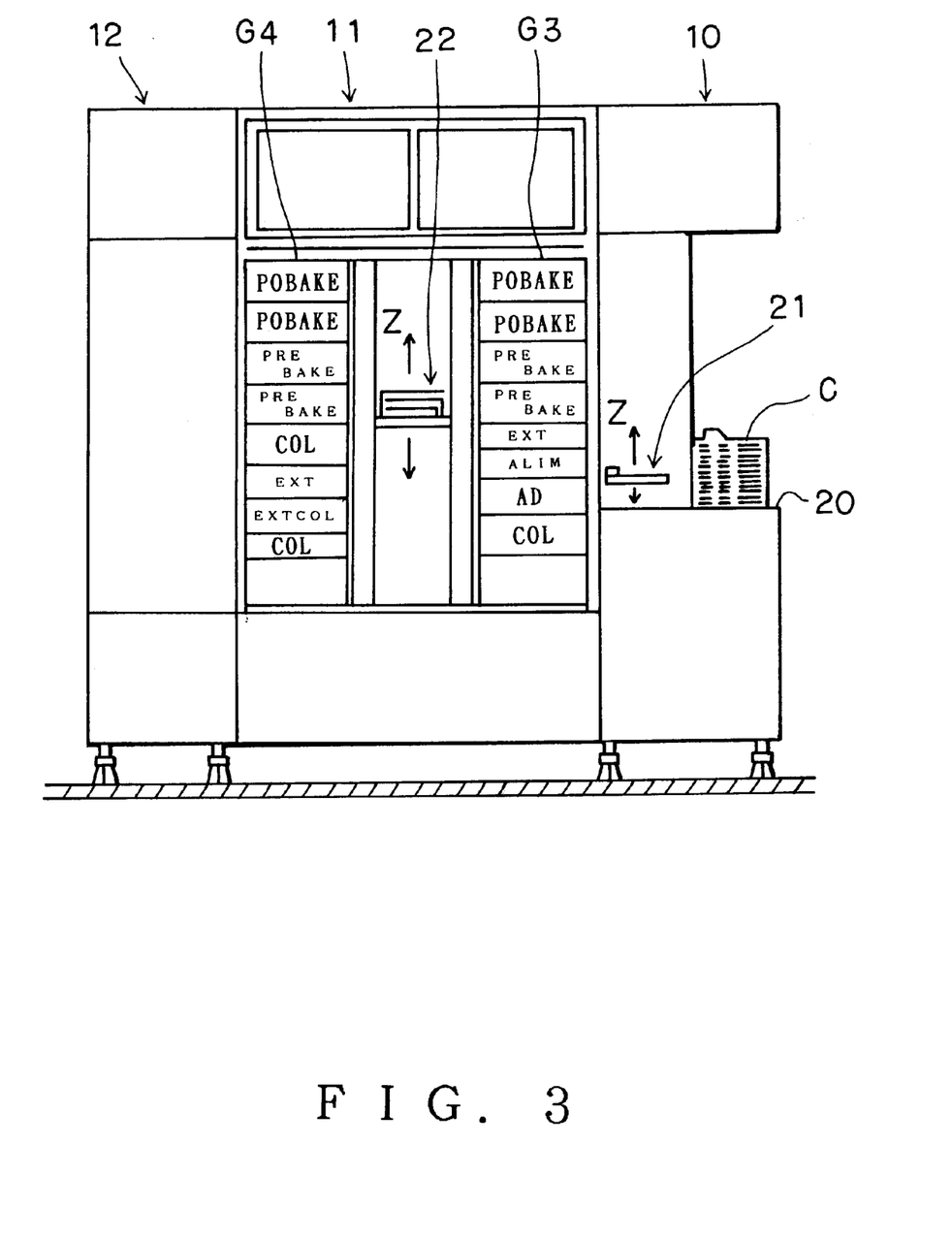
FIG. 3 is a rear view of the coating and developing apparatus shown in FIG. 1.

FIG. 1 is a plan view, FIG. 2 is a front view and FIG. 3 is a rear view of the coating and developing apparatus concerning an embodiment of the present invention.

As shown in FIGS. 1 and 3, this coating and developing unit 1 is composed of a cassette station 10, a process station 11 and an interface section 12, connected integrally. In the cassette station 10, a plurality of wafers W (25, for example) is introduced into the coating and developing unit 1 from outside in units of cassettes C, and then transferred out from the coating and developing unit 1. Wafers W are also transferred into and out of the cassettes C. In the process station 11, various kinds of single-wafer processing units are disposed multi-tiered in a predetermined position. These processing units perform a predetermined process upon the wafer W one by one during the coating and developing steps. In the interface section 12, the wafers W are delivered to and from an exposure unit 13 disposed next to the coating and developing unit 1.

In the cassette station 10, as shown in FIG. 1, a plurality of cassettes C (four, for example) is mounted on a cassette mounting table 20 in the position of a positioning projection 20a. The cassettes C are mounted along a line in the X-direction (the up and down direction in FIG. 1). The opening of the cassettes C, through which the wafers W are taken in and out, face the process station 11. A wafer transfer unit 21 moves in the cassettes C arrangement direction (X-direction). It also moves in the wafers W arrangement direction (Z-direction; vertical direction), the direction in which the wafers W stored inside the cassettes C are arranged. The wafer transfer unit 21 moves freely along a transfer path 21a and makes access selectively to each cassette C.

The wafer transfer unit 21 rotates freely in the θ direction and makes access to an alignment unit (ALIM) and an extension unit (EXT). The alignment unit and the extension unit belong to a multi-tiered units section of a third processing unit group G3 on the process station 11 side.

In the process station 11 as shown in FIG. 1, a vertical-transfer type transfer unit 22 is disposed in the center.

Around it, two or more processing units are disposed multi-tiered to form processing unit groups. In such a coating and developing unit 1, five processing unit groups G1, G2, G3, G4 and G5 may be disposed. A first processing unit group G1 and a second group G2 are disposed on the front side of the system. A third processing unit group G3 is disposed next to the cassette station 10. A fourth processing unit group G4 is disposed next to the interface section 12. And a fifth processing unit group G5 shown by a broken line can be disposed on the rear side. The transfer unit 22 rotates freely in the θ direction and moves in the Z-direction in order to deliver wafers W to and from various processing units.

In the first processing unit group G1 as shown in FIG. 2, two spinner-type processing units, such as a resist coating unit (COT) and a developing unit (DEV), are two-tiered from the bottom in order. These units perform a predetermined process with the wafers W mounted on a spin chuck inside a cup CP. In the second processing unit group G2 as in the first processing unit group G1, two spinner-type processing units, such as a resist coating unit (COT) and a developing unit (DEV), are two-tiered from the bottom in order.

In the upper portion of the coating and developing unit 1 as shown in FIG. 2, high-efficiency filters 23, such as UPLA filters, are disposed in each of the above-mentioned zones (the cassette station 10, the process station 11, the interface section 12). The high-efficiency filter 23 catches and removes particles and organic materials from the air supplied from the upper-stream side of the filter 23. Thus, through the high-efficiency filter 23, a clean down-flow of air is supplied from above in the direction of the solid arrow or the dotted arrow in FIG. 2. The clean air flows to the cassette mounting table 20, the transfer path 21a of the wafer transfer unit 21, the first processing unit group G1, the second group G2, the third through fifth processing unit groups G3, G4 and G5 which will be mentioned later, and the interface section.

In the third processing unit group G3 as shown in FIG. 3, eight oven-type processing units are multi-tiered, performing a predetermined process with the wafers W mounted upon the mounting table. The units are, for example, a cooling unit (COL) for cooling the wafer W, an adhesion unit (AD) for performing a hydrophobic process to improve the fixity of the resist, an alignment unit (ALIM) for positioning the wafer W, an extension unit (EXT), two pre-baking units (PREBAKE) for heating before exposure and two post-baking units (POBAKE), from the bottom in order.

Similarly, in the fourth processing unit group G4 as shown in FIG. 3, eight oven-type processing units are multi-tiered, performing a predetermined process with the wafers W mounted upon the mounting table. The units are, for example, a cooling unit (COL) for cooling the wafer W, an extension/cooling unit (EXTCOL) which also cools, an extension unit (EXT), an adhesion unit (AD), two pre-baking units (PREBAKE) and two post-baking units (POBAKE), from the bottom in order.

Heat interference between the units can be kept at a minimum by disposing such units with low processing temperature as a cooling unit (COL) and an extension unit (EXTCOL) in the bottom and disposing such units with high processing temperature as a pre-baking unit (PREBAKE), a post-baking unit (POBAKE) and an adhesion unit (AD) on the top.

As shown in FIG. 1, the interface section 12 has the same size as the aforementioned process station in the depth direction (X-direction) but is smaller in the width direction. As shown in FIGS. 1 and 2, a movable pick-up cassette CR and a stable buffer cassette BR are two-tiered at the front side of the interface section 12. A peripheral exposure unit 24 is disposed at the rear side.

A wafer transfer unit 25 is disposed in the center of the interface section 12. The wafer transfer unit 25 moves in the X-direction and the Z-direction (vertical direction). It makes access to both cassettes CR and BR and to the peripheral exposure unit 24. The wafer transfer unit 25 also moves freely in the θ direction and makes access to an extension unit (EXT). The extension unit belongs to the fourth processing unit group G4 at the process station 11 side. The transfer unit 25 also makes access to the wafer delivery table (not shown) at the exposure unit side.

Figure 4:
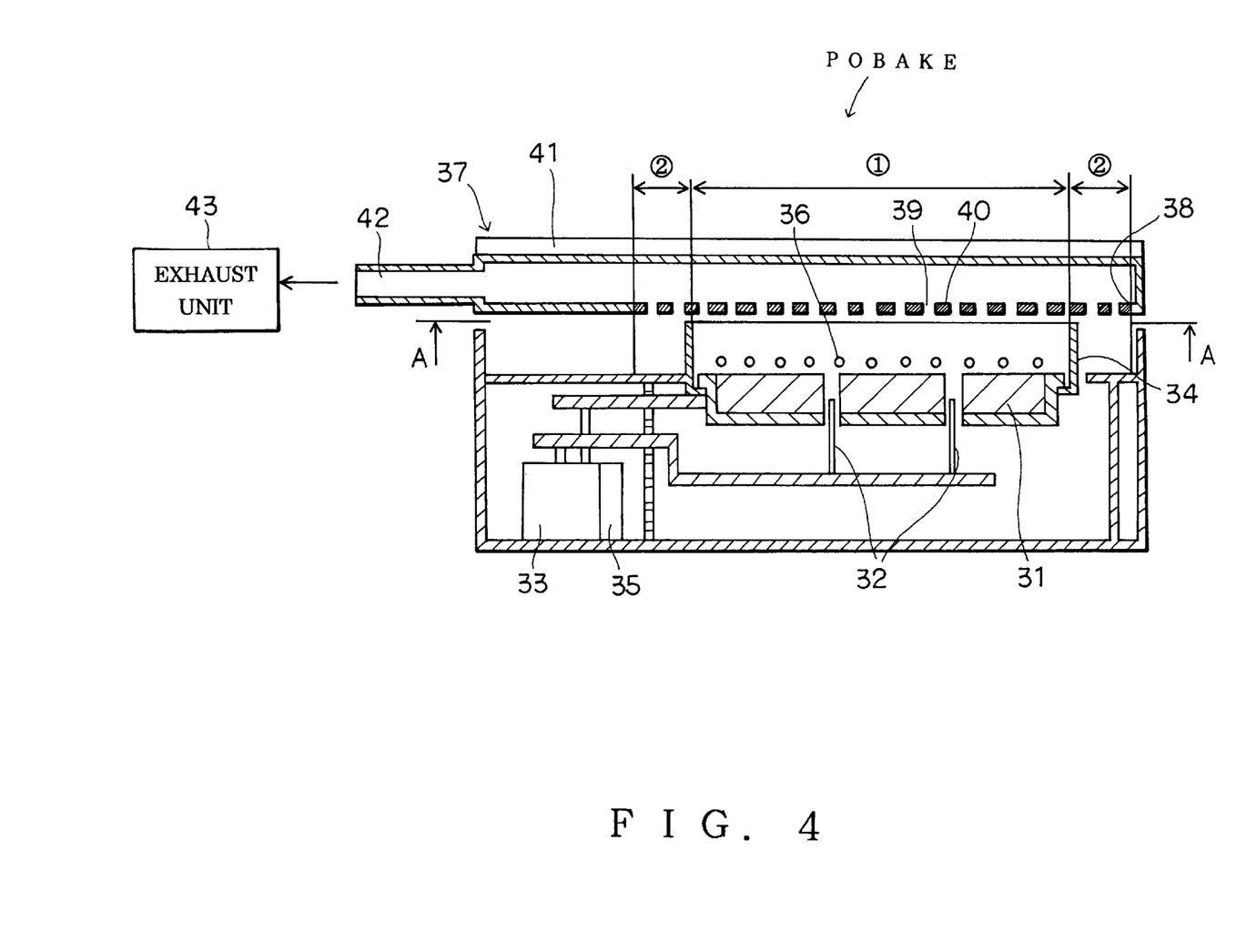
FIG. 4 is a front view of a post-baking unit (POBAKE) concerning the heating apparatus of the present invention.

FIG. 4 is a front view of a post-baking unit (POBAKE) concerning a heating apparatus of the present invention.

As shown in FIG. 4, a hot plate 31 for heating a wafer W is disposed approximately at the center of the post-baking unit (POBAKE). A pipe (not shown) is disposed inside the hot plate 31 wherein a heated liquid flows. The hot plate 31 is heated by the heated liquid flowing through the pipe. A plurality of support pins 32 receive and deliver the wafer W. The support pins 32 appear from and disappear into the hot plate 31, by moving up and down with an elevating and lowering mechanism 33 disposed beneath the hot plate 31.

A shutter member 34, also appearing and disappearing, is disposed around and surrounding the hot plate 31. This shutter member 34 moves up and down by an elevating and lowering mechanism 35 disposed beneath the hot plate 31. Inside the wall of the shutter member 34, a plurality of air supply holes 36 are disposed for supplying a high-temperature gas such as an inert gas N2. The air supply hole 36 is connected to a high-temperature gas supply unit (not shown).

A box-shaped exhaust cover 37 is disposed above the hot plate 31.

Figure 5:
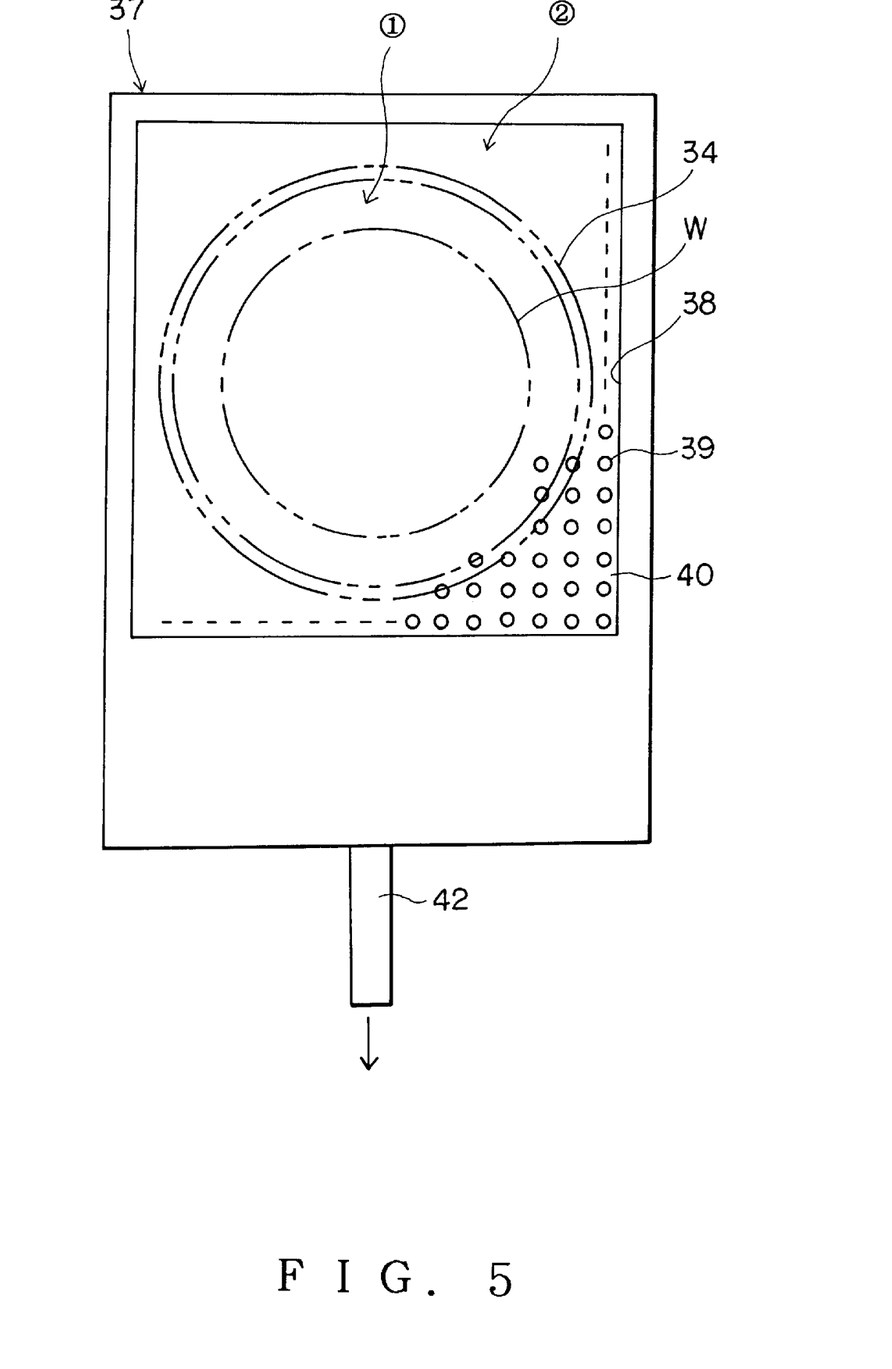
FIG. 5 is a drawing of an exhaust cover seen from the A—A arrow direction in FIG. 4.

FIG. 5 is a drawing of the exhaust cover 37 seen from the A—A arrow direction in FIG. 4.

As shown in FIGS. 4 and 5, an exhaust hole 38 is disposed at the side of the exhaust cover 37 facing the hot plate 31. The size of the exhaust hole 38 is large enough to cover not only the first region ① above the hot plate 31 but also the second region ② surrounding the first region ①. A plate member 40 with a plurality of openings 39 is disposed at the mouth of the exhaust hole 38.

A heating unit 41 for heating inside the exhaust cover 37 is disposed above the exhaust cover 37.

An exhaust pipe 42 is connected to one side of the exhaust cover 37, and an exhaust unit 43 is connected to this exhaust pipe 42. The above-mentioned first region ① and second region ② are exhausted by the exhaust unit 43 through the exhaust hole 38.

The movements will be explained next.

First, with the support pin 32 up and appearing from the hot plate 31 and the shutter member 34 down, the wafer W is handed over from the transfer unit 22 upon the support pin 32.

Then, the support pin 32 descends and disappears into the hot plate 31 and the shutter member 34 comes up, forming a closed space between the hot plate 31, the shutter member 34 and the exhaust cover 37. The wafer W is heated in such a condition.

Figure 6:
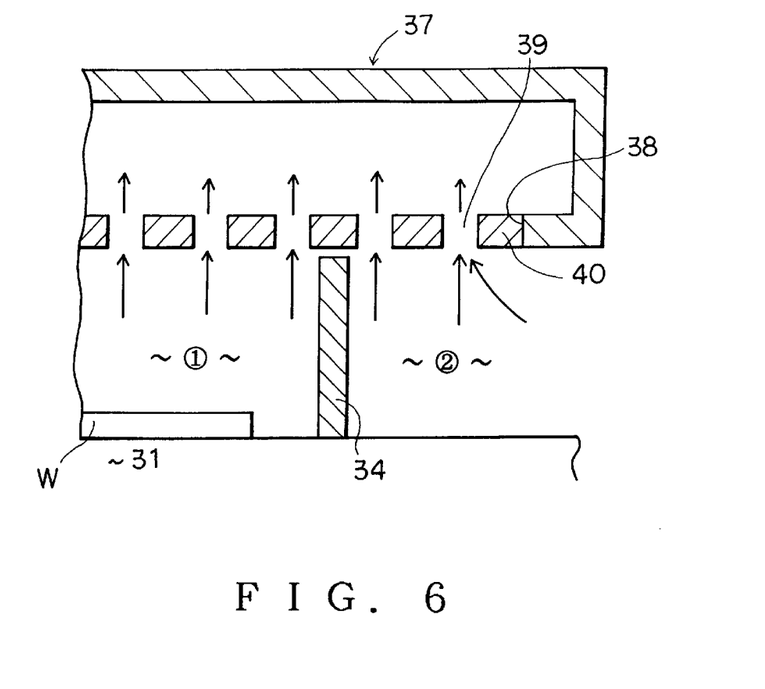
FIG. 6 is a partially enlarged view of FIG. 4.

FIG. 6 is a partially enlarged view of FIG. 4 showing the above.

As shown by the solid arrow in FIG. 6, the exhaust cover 37 not only exhausts the first region ① above the hot plate 31 but also the second region ② surrounding the first region ①, outside the shutter member 34.

Figure 7:
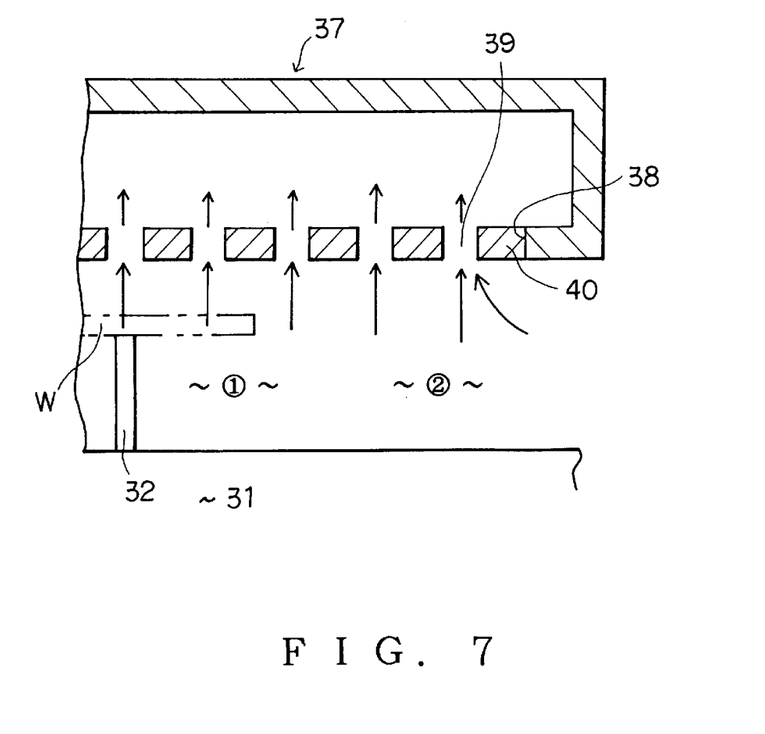
FIG. 7 is a partially enlarged view of FIG. 4.

Then the support pin 32 comes up, lifting the wafer W from the hot plate 31. At the same time, the shutter member 34 goes down and the wafer W is handed over to the transfer unit 22. FIG. 7 is a partially enlarged view of FIG. 4 showing this situation.

During the above movements when the wafer W is not being heated, the exhaust cover 37 exhausts the first region ① above the hot plate 31 and the second region ② surrounding the first region ①, as shown by the solid arrow in FIG. 7.

As can be seen from the above, according to the embodiment, the first region ① above the hot plate 31 and the second region ② surrounding it are exhausted. Thus, the solvent volatilized in the first region ① is also exhausted in the second region ② and will not leak outside the unit, preventing ill influence to the other processes. Also, the shutter member 34 comes in between the first region ① and the second region ② during the heating process when the density of the volatilized solvent becomes high. Therefore, the flow of exhaustion through the exhaust cover 37 in the second region ② does not disturb the flow of exhaustion through the exhaust cover 37 in the first region ①. The volatilized solvent rarely leaks out from the shutter member 34, still less outside the unit. Moreover, since the exhaust cover 37 exhausts even when the heating process is not performed, the volatilized solvent will not leak outside the unit when the shutter member 34 descends to deliver the wafer W to the transfer unit 22 after the heating process.

According to the embodiment, since a surrounding gas not including any solvent is introduced into the exhaust cover 37 from the second region ②, the density of the volatilized solvent inside the exhaust cover 37 decreases, preventing the volatilized solvent from forming a dew and sticking inside the exhaust cover 37. Also, since the heating unit 41 heats inside the exhaust cover 37, no dew will form at all.

Since the exhaust cover 37 is box-shaped, the exhaust cover 37 itself will act as a buffer for temporarily storing the gas to be exhausted. And since the gas is exhausted from the side, exhaustion is performed more equally inside the exhaust cover 37.

Figure 8:
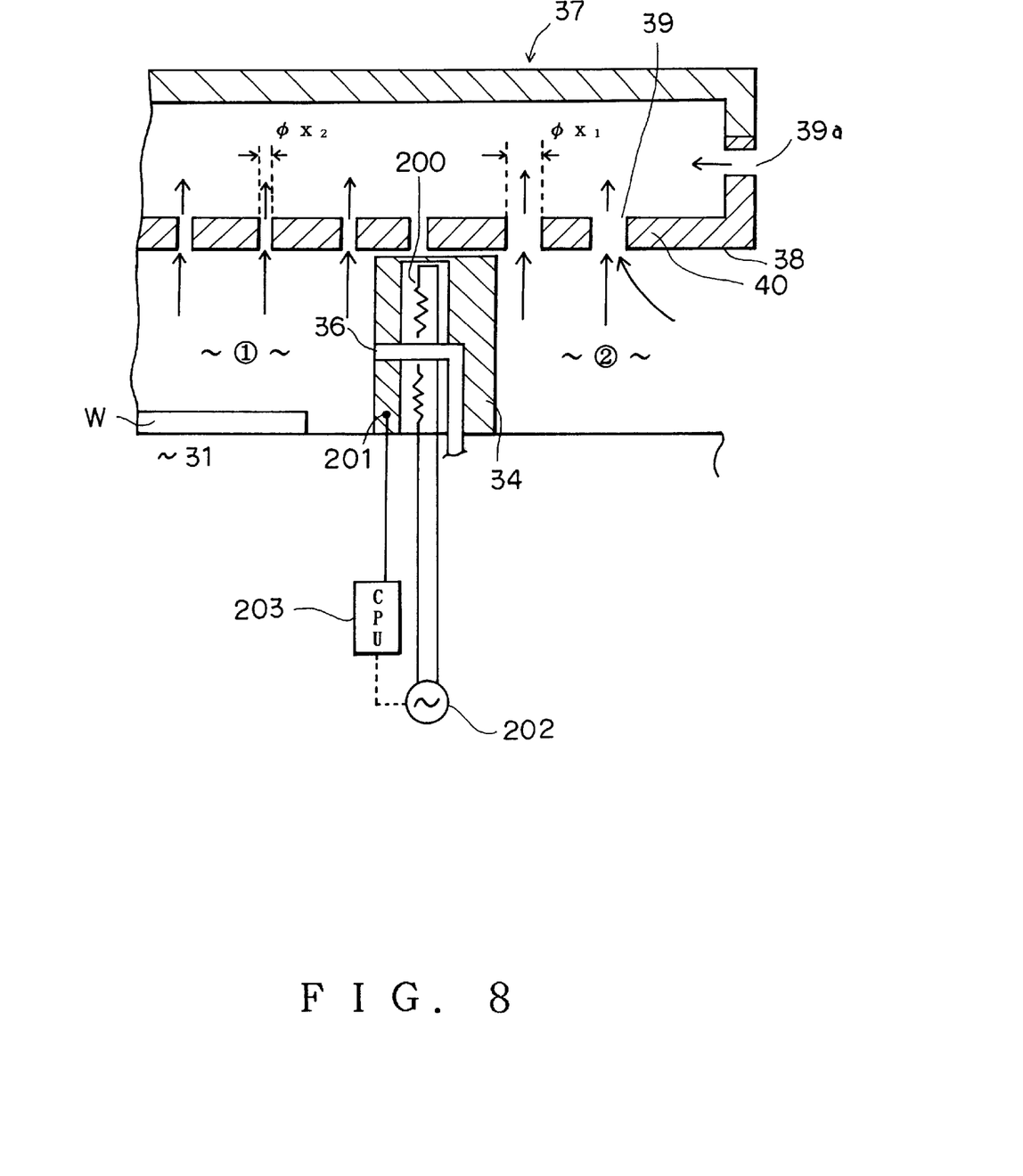
FIG. 8 is a drawing showing another embodiment of FIG. 6.

Next, another embodiment of the invention will be explained. FIG. 8 is a drawing showing another embodiment of FIG. 6, a partially enlarged view of FIG. 4.

As shown in FIG. 8, a heating mechanism such as a heater 200 and a temperature detecting mechanism such as a thermocouple 201 for detecting the temperature of the shutter member 34 are disposed inside the shutter member 34. The heater 200 is connected to a power supply unit such as an AC power source 202. The electricity from the AC power source 202 keeps the temperature of the shutter member 34 at a predetermined temperature. The data of the temperature detected by the thermocouple 201 is sent to a control mechanism such as a CPU 203. According to the detected temperature data, the CPU 203 instructs the AC power source 202 the amount of electricity to be sent to the heater 200. Thus, the temperature of the shutter member 34 can be set to a desired temperature, for example, to such a temperature that suppresses the sticking of the solvent volatilized from the wafer W. Therefore, it is possible to prevent the solvent from sticking and becoming particles, improving the yield rate of the wafer W processing.

The N2 gas supplied from the air supply hole 36 disposed in the shutter member 34 can also be heated to a desired temperature. Therefore, if the temperature of N2 and the temperature inside the process space are set in approximately the same temperature, the temperature of the wafer W will not drop near the N2 gas supply hole. The surface temperature of the wafer W will become more uniform, improving the yield rate of the wafer W processing.

The diameter of the opening 39 above the first region ① is set as $\phi \times 2$, and the diameter of the opening 39 above the second region ② is set as $\phi \times 1$. The relation between these diameters is set as $\phi \times 1 > \phi \times 2$.

Therefore, the exhaust amount per opening in the first region ① is smaller than the exhaust amount per opening in the second region ②. By changing the diameter of the opening 39 in the first region ① and the second region ②, the exhaust amount from the process space within the shutter member 34 may be adjusted. Thus, the warmness inside the process space is improved and the temperature of the hot plate 31 is stabilized. As a result, the surface temperature of the wafer W will become more uniform, improving the process yield rate.

The relationship between the diameter of the opening 39 above the first region ① and the diameter of the opening 39 above the second region ② was set as $\phi \times 1 > \phi \times 2$ in the above. However, it is needless to say that this relationship may be set as $\phi \times 1 < \phi \times 2$ in a processing of the wafer W and the like.

An opening 39a is also disposed at the side wall of the exhaust cover 37. A gas may be introduced through this opening 39a as well. Thus by disposing the opening 39a at the side wall of the exhaust cover 37, the vertical flow of air introduced through the openings 39 in the first region ① and the second region ② may be changed to a faster horizontal flow. Air eddy is prevented within the exhaust cover 37 and the sticking of the solvent included in the absorbed gas in the exhaust cover 37 is also prevented. Therefore, it is possible to prevent the generation of particles caused by the sticking solvent, improving the yield rate of the wafer W processing. The maintenance period for cleaning inside the exhaust cover 37 may become longer, improving the working ratio of the apparatus.

Figure 9:
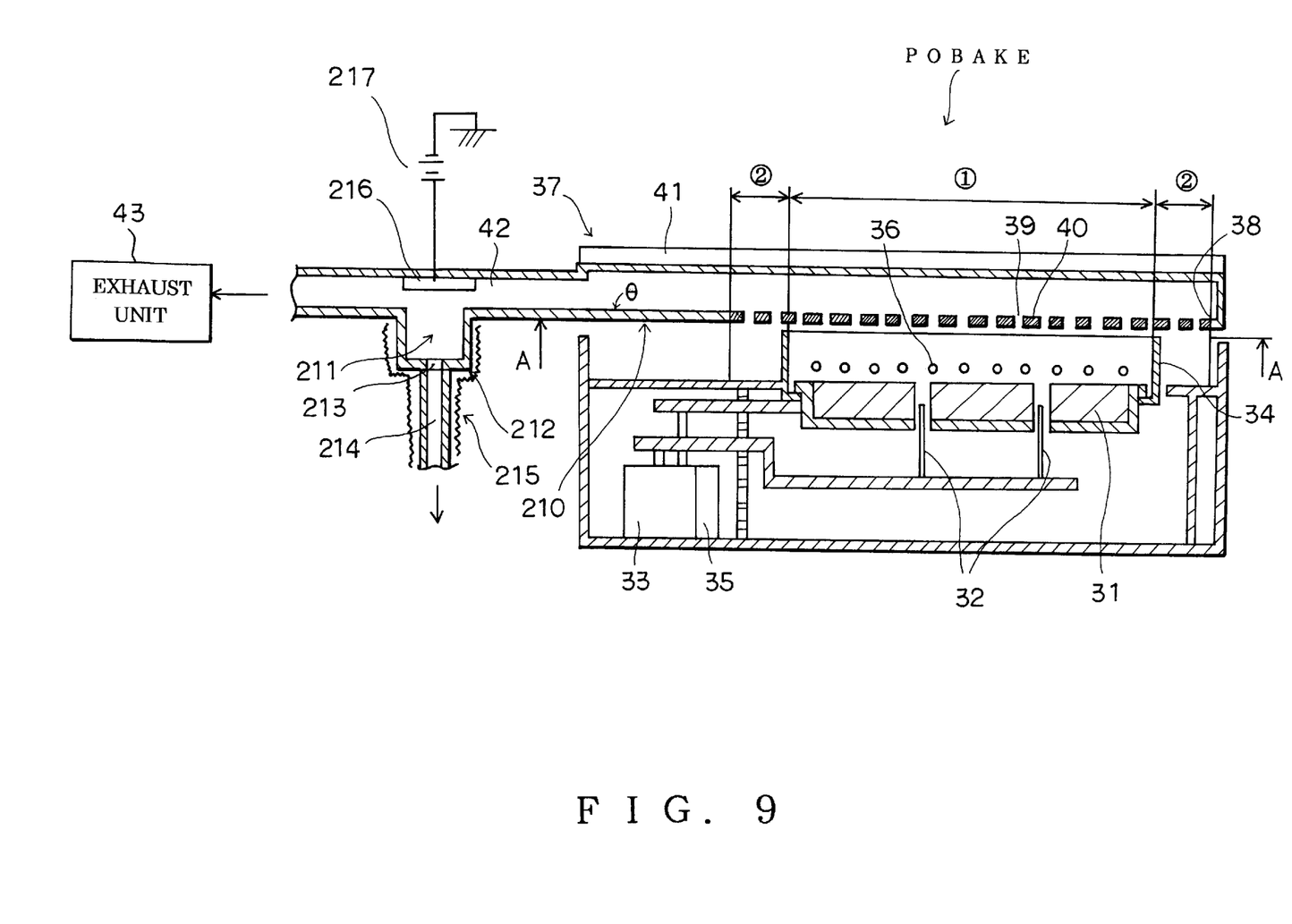
FIG. 9 is a drawing showing another embodiment of FIG. 4.

Next, another embodiment of the present invention will be explained. FIG. 9 is a front view showing another embodiment of the post-baking unit (POBAKE) shown in FIG. 4.

As shown in FIG. 9, a bottom wall 210 of the exhaust pipe 42 acts as an exhaust path at the exhaust unit 43 side, slanting downward in a predetermined degree θ towards the exhaust unit 43. This is to let the liquid flow in the direction of the exhaust unit 43, in case the dew forms inside the exhaust cover 37 by any chance. Therefore, the condensed dew is prevented from leaking out from the opening 39 of the exhaust cover 37 and sticking to the wafer W, and the yield rate of the wafer W processing is improved.

Furthermore, in the bottom wall 210 at the exhaust unit 43 side, a trap portion 212 with a pool 211 is disposed for storing the condensed dew. Beneath the pool 211 of the trap portion 212, an exhaust port 213 is disposed for exhausting the condensed dew stored in the pool 211. The exhaust port 213 is connected to a drainage path 214 for exhausting.

A heating mechanism such as a heater 215 is disposed at the side of the pool 211, the exhaust port 213 and the drainage path 214 to prevent the solidification of the condensed dew.

A cooling mechanism 216 disposed above the trap portion 212 forcibly liquefies the solvent included in the gas inside the exhaust cover 37. A DC power source is connected to the cooling mechanism 216 as a power supply mechanism for supplying electricity to the cooling mechanism 216. Thus, the cooling mechanism 216 forcibly liquefies the solvent included in the gas within the exhaust cover 37 to be collected by the trap portion 212.

By composing the apparatus as mentioned above, the gas exhausted by the exhaust unit 43 does not include any solvent, prolonging the life duration of the exhaust unit 43.

Figure 10:
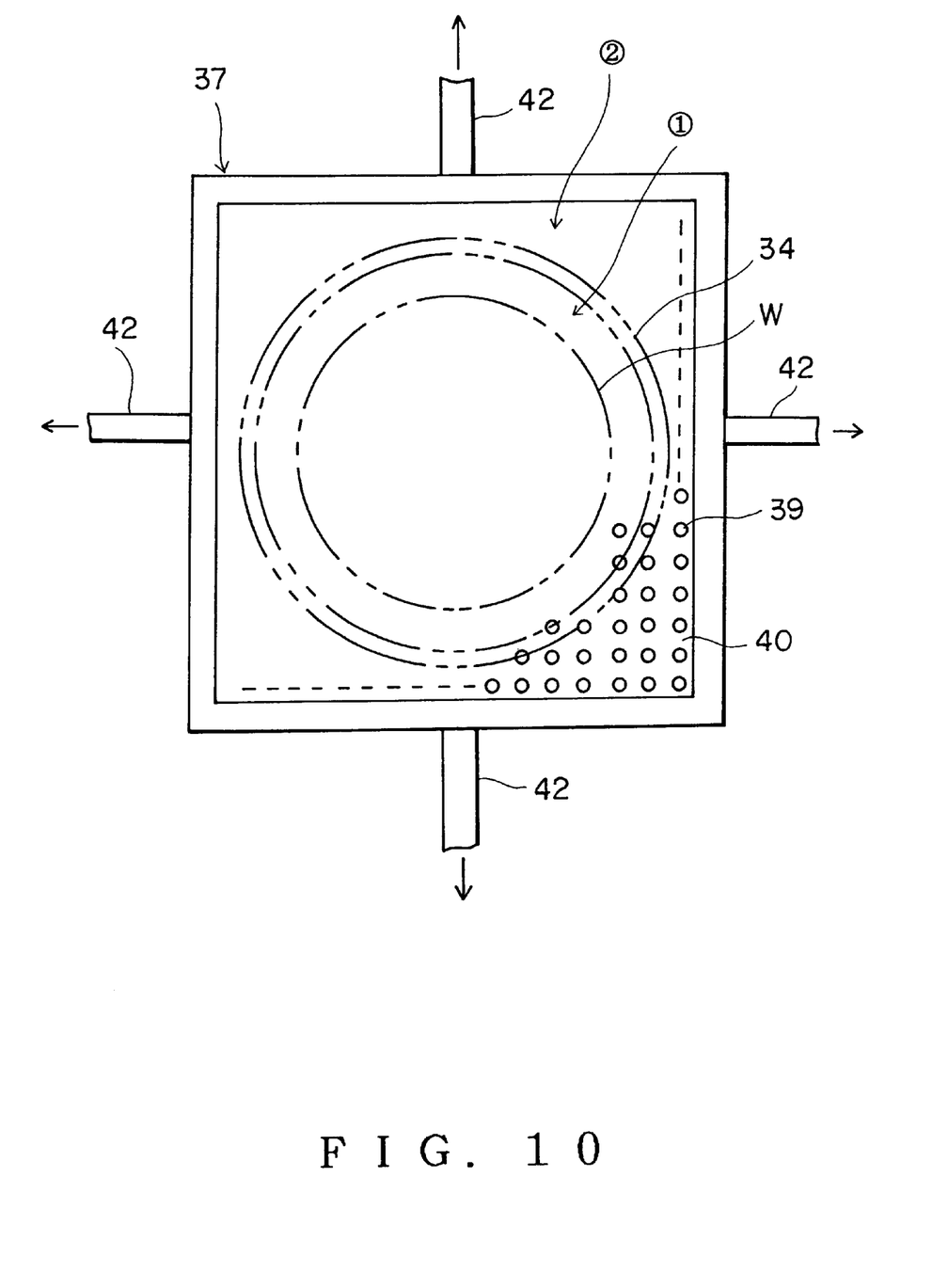
FIG. 10 is a drawing showing another embodiment of FIG. 5.

Next, another embodiment of the present invention will be explained. FIG. 10 is a drawing showing another embodiment of the exhaust cover shown in FIG. 5, seen from the A—A arrow direction in FIG. 4.

As shown in FIG. 10, the exhaust pipes 42 are disposed in a plurality of directions, for example four directions, as a path for exhausting the exhaust cover 37. The exhaust pipes 42 disposed in four directions are connected to the exhaust unit 43. Since the exhaust cover 37 is exhausted by the exhaust pipes 42 from four directions, it may be exhausted more uniformly, preventing unequal exhaustion above the wafer W.

Thus, the yield rate of the wafer W processing is improved.

Figure 11:
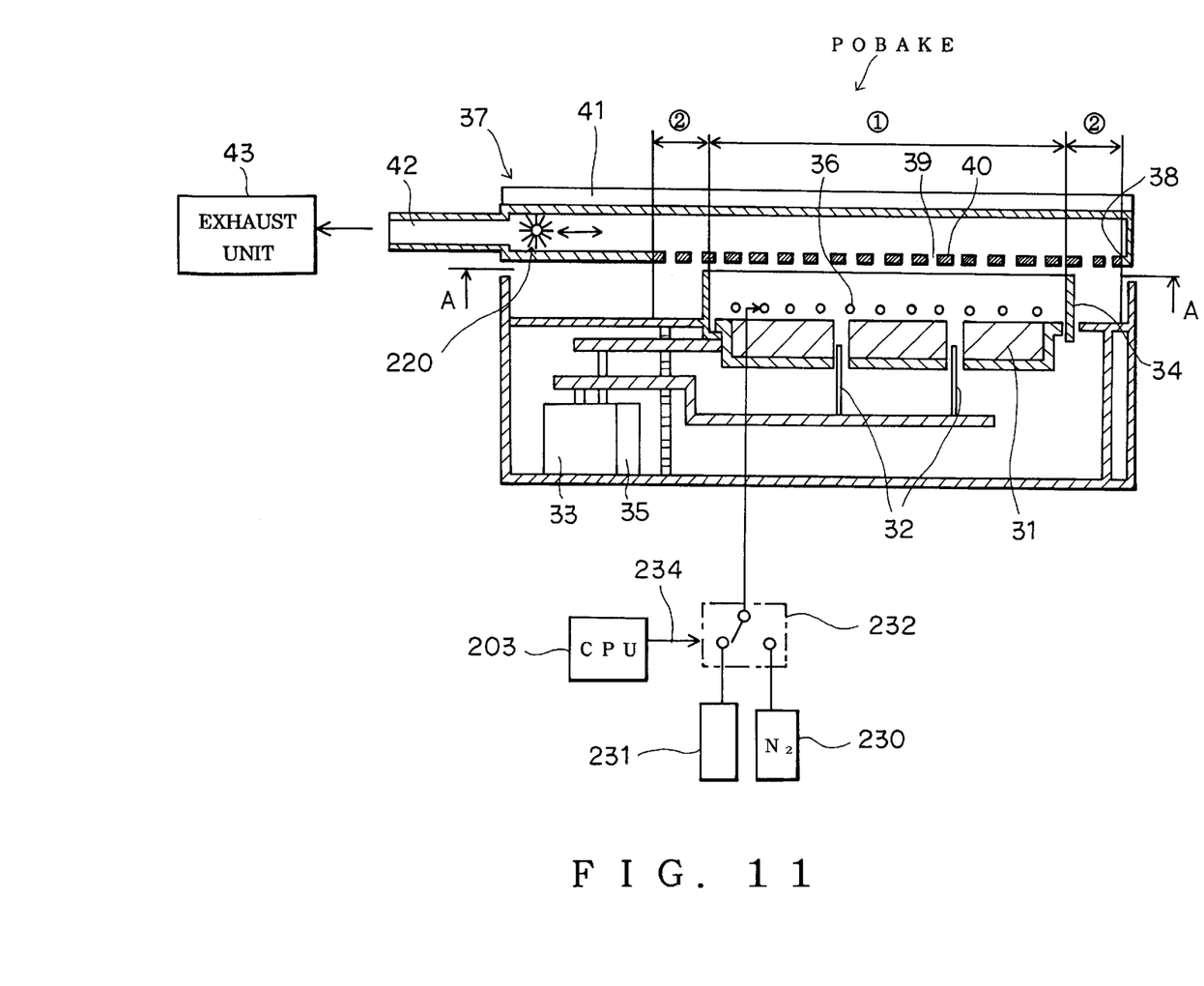
FIG. 11 is a drawing showing another embodiment of FIG. 4.

Next, another embodiment of the present invention will be explained. FIG. 11 is another embodiment of the front view of the post-baking unit (POBAKE) concerning the heating unit shown in FIG. 4.

Figure 12:
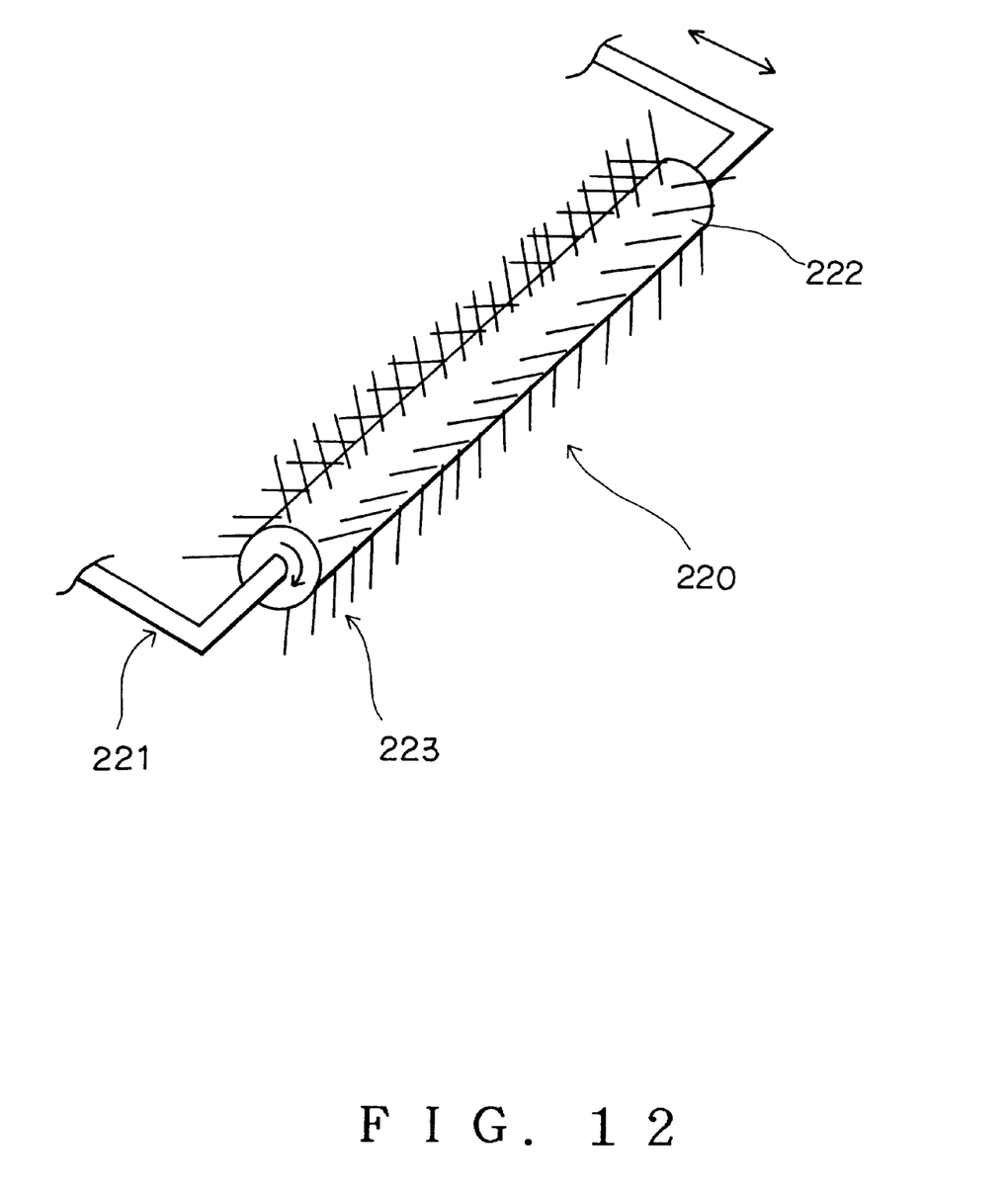
FIG. 12 is a partially enlarged perspective view of FIG. 11.

As shown in FIG. 11, a cleaning brush 220 is disposed inside the exhaust cover 37 as a cleaning mechanism movable within the exhaust cover 37. The cleaning brush 220 is held by an arm 221 as shown in FIG. 12. It moves and rotates with the movement of the arm 221. The cleaning brush 220 is composed of a body 222 and a plurality of brushes 223 planted in the body 222.

The cleaning brush 220 operates after the processing of the wafer W or at the maintenance time of the apparatus, and cleans the waste sticking inside the exhaust cover 37.

Thus, the cycle of maintenance for cleaning inside the exhaust cover 37 is prolonged, improving the working ratio of the apparatus.

A plurality of openings 36 disposed in the shutter member 34 is connected to a three-way valve 232. The three-way valve 232 chooses either one of a high-temperature gas supply unit, such as an inert gas N2 supply unit 230, and a cleaning gas supply unit 231. The cleaning gas supply unit 231 supplies a gas for cleaning the waste sticking inside the process space and the exhaust cover 27.

The three-way valve 232 is controlled by an instruction signal 234 of the CPU 203 as a control mechanism.

That is, the three-way valve 232 connects with the N2 supply unit 230 by the instruction signal 234 of CPU 203 when the wafer W is being processed. And the three-way valve 232 connects with the cleaning gas supply unit 231 by the instruction signal 234 of CPU 203 after the wafer W is processed or at a predetermined unit maintenance time, in need of cleaning.

By composing the apparatus in the above way, the solvent and the like sticking inside the apparatus may be cleaned effectively, preventing the generation of particles and improving the yield rate of the wafer W processing.

Cleaning efficiency is further improved by using the aforementioned cleaning brush in combination.

Needless to say, the present invention is not restricted to the above-mentioned embodiments.

For example, although the exhaust hole 38 was rectangular in the above embodiments, it may also be circular. By making the exhaust hole circular, the exhaust balance improves, and the possibility of turbulence generation as mentioned above will be further decreased.

The object to be processed is not restricted to a wafer W, but it is also applicable to other objects such as an LCD substrate.

What is claimed is:

1. A heating apparatus comprising:
    a heating region having a first region for heating a mounted target object thereon;
    an exhaust cover having an exhaust hole disposed facing said first region and a second region surrounding the first region;
    an exhausting means for exhausting the first region and the second region through said exhaust hole; and
    a shutter member for closing up a space between a periphery of said first region and said exhaust cover when heating the target object.

2. The heating apparatus as set forth in claim 1, wherein said exhausting means exhausts the first region and the second region through the exhaust hole even when said target object is not heated.

3. The heating apparatus as set forth in claim 2, wherein said exhaust cover is box-shaped and is connected to said exhausting means at the side.

4. The heating apparatus as set forth in claim 3, further comprising a heating means for heating said exhaust cover.

5. The heating apparatus as set forth in claim 4, further comprising a plate member disposed at the mouth of the exhaust hole and having a plurality of openings.

6. The heating apparatus as set forth in claim 5, wherein the diameter of the opening in the first region differs from the diameter of the opening in the second region.

7. The heating apparatus as set forth in claim 6, wherein the diameter of the opening in the first region is smaller than the diameter of the opening in the second region.

8. The heating apparatus as set forth in claim 1, wherein a heating mechanism is disposed in said shutter member.

9. The heating apparatus as set forth in claim 1, wherein a trap portion for removing impurities included in the exhausted air is disposed in an exhaust path of said exhausting means.

10. The heating apparatus as set forth in claim 1, further comprising a cleaning mechanism for removing the impurities inside said exhaust cover.

11. A heating apparatus comprising:
    a heating region having a first region for heating a mounted target object thereon;
    an exhausting means for exhausting said first region, a second region surrounding the first region, and the first region and the second region at the same time;
    wherein the first region and the second region are exhausted even when said target object is not heated; and
    wherein the diameter of the opening in the first region differs from the diameter of the opening in the second region.

12. The heating apparatus as set forth in claim 11, wherein a trap portion for removing impurities included in the exhausted air is disposed in an exhaust path of said exhausting means.

13. The heating apparatus as set forth in claim 12, further comprising a cleaning mechanism for removing impurities inside said exhaust cover.

14. A heating apparatus comprising:
    a heating region having a first region for heating a mounted target object thereon;

an exhausting means for exhausting said first region, a second region surrounding the first region, and the first region and the second region at the same time;

wherein the first region and the second region are exhausted even when said target object is not heated; and wherein the diameter of the opening in the first region is smaller than the diameter of the opening in the second region.

15. The heating apparatus as set forth in claim 14, wherein a trap portion for removing impurities included in the exhausted air is disposed in an exhaust path of said exhausting means.

16. The heating apparatus as set forth in claim 15, further comprising a cleaning mechanism for removing impurities inside said exhaust cover.

17. A heating apparatus comprising:

a heating region having a first region whereupon a target object is mounted and heated;

an exhaust cover having an exhaust hole disposed facing said first region and a second region surrounding the first region;

an exhaust connected to said exhaust hole that exhausts air in the first region and the second region through said exhaust hole;

a shutter member that closes up a space between a periphery of said first region and said exhaust cover when the target object is heated.

18. The heating apparatus as set forth in claim 17, wherein the first region and the second region are exhausted through the exhaust hole even when said target object is not heated.

19. The heating apparatus as set forth in claim 18, wherein said exhaust cover is box-shaped and is connected to said exhaust at the side.

20. The heating apparatus as set forth in claim 18, further comprising a heater that heats said exhaust cover.

21. The heating apparatus as set forth in claim 20, further comprising a plate member disposed at the mouth of the exhaust hole and having a plurality of openings.

22. The heating apparatus as set forth in claim 21, wherein the diameter of the opening in the first region differs from the diameter of the opening in the second region.

23. The heating apparatus as set forth in claim 22, wherein the diameter of the opening in the first region is smaller than the diameter of the opening in the second region.

24. The heating apparatus as set forth in claim 17, wherein a heating mechanism is disposed in said shutter member.

25. The heating apparatus as set forth in claim 17, further comprising a trap that removes impurities included in the exhausted air, said trap disposed in an exhaust path of said exhaust.

26. The heating apparatus as set forth in claim 17, further comprising a cleaner that removes the impurities inside said exhaust cover.

27. A heating apparatus comprising:

a heating region having a first region whereupon a target object is mounted and heated;

an exhaust that exhausts air in said first region, a second region surrounding the first region, and the first region and the second region at the same time;

wherein the first region and the second region are exhausted even when said target object is not heated; and wherein the diameter of the opening in the first region differs from the diameter of the opening in the second region.

28. The heating apparatus as set forth in claim 27, further comprising a trap that removes impurities included in the exhausted air, said trap disposed in an exhaust path of said exhaust.

29. The heating apparatus as set forth in claim 28, further comprising a cleaner that removes impurities inside said exhaust cover.

30. A heating apparatus comprising:

a heating region having a first region whereupon a target object is mounted and heated;

a second region surrounding said first region;

an exhaust connected to said first and second region that exhausts air in said first region, said second region, and the first region and the second region at the same time;

wherein the first region and the second region are exhausted even when said target object is not heated; and wherein the diameter of the opening in the first region is smaller than the diameter of the opening in the second region.

31. The heating apparatus as set forth in claim 30, further comprising a trap that removes impurities included in the exhausted air and disposed in an exhaust path.

32. The heating apparatus as set forth in claim 31, further comprising a cleaner that removes impurities in said exhausted air.

* * * * *